United States Patent
Takahashi

(10) Patent No.: US 7,403,074 B2
(45) Date of Patent: Jul. 22, 2008

(54) OSCILLATOR

(75) Inventor: Naoki Takahashi, Kanagawa (JP)

(73) Assignee: Sony Corporation (JP)

( * ) Notice: Subject to any disclaimer, the term of this patent is extended or adjusted under 35 U.S.C. 154(b) by 864 days.

(21) Appl. No.: 10/785,957

(22) Filed: Feb. 26, 2004

(65) Prior Publication Data

US 2005/0190000 A1    Sep. 1, 2005

(51) Int. Cl.
*H03B 5/24* (2006.01)
*H03L 7/099* (2006.01)

(52) U.S. Cl. ......................................... 331/57; 327/295

(58) Field of Classification Search .................... 331/57, 331/34, 177 R; 327/280, 165, 166, 295
See application file for complete search history.

(56) References Cited

U.S. PATENT DOCUMENTS

| 5,596,302 A | | 1/1997 | Mastrocola et al. |
| 5,799,051 A | | 8/1998 | Leung et al. |
| 6,005,448 A | * | 12/1999 | Pickering et al. ............... 331/57 |
| 6,166,572 A | * | 12/2000 | Yamaoka ..................... 327/149 |
| 6,191,658 B1 | * | 2/2001 | Fairbanks ..................... 331/57 |
| 6,657,502 B2 | * | 12/2003 | Bushman et al. ............... 331/57 |
| 6,670,858 B2 | * | 12/2003 | Tang ............................. 331/57 |

FOREIGN PATENT DOCUMENTS

| FR | 2 548 486 A | 1/1985 |
| JP | 6-188631 A | 7/1994 |
| JP | 6-216721 A | 8/1994 |
| JP | 7-264023 A | 10/1995 |
| JP | 7-283697 A | 10/1995 |

OTHER PUBLICATIONS

EPO Search Report dated Jun. 3, 2004.

* cited by examiner

*Primary Examiner*—Dinh T. Le
(74) *Attorney, Agent, or Firm*—Rader Fishman & Grauer PLLC; Ronald P. Kananen

(57) ABSTRACT

An oscillator, generating multiple phases of clock signals having a uniform phase difference with a high precision by a simple configuration, includes a plurality of NAND circuits ND1 to ND8 having the same number of input terminals connected in a ring. Eight NAND circuits are connected, and an output node of each NAND circuit is connected to an input node of each NAND circuit up to the NAND circuit connected exactly two places, that is, the number of input terminals' worth of places, ahead.

5 Claims, 11 Drawing Sheets

8 PHASES OF CLOCKS

SIGNAL FIXING

6 PHASES OF CLOCKS

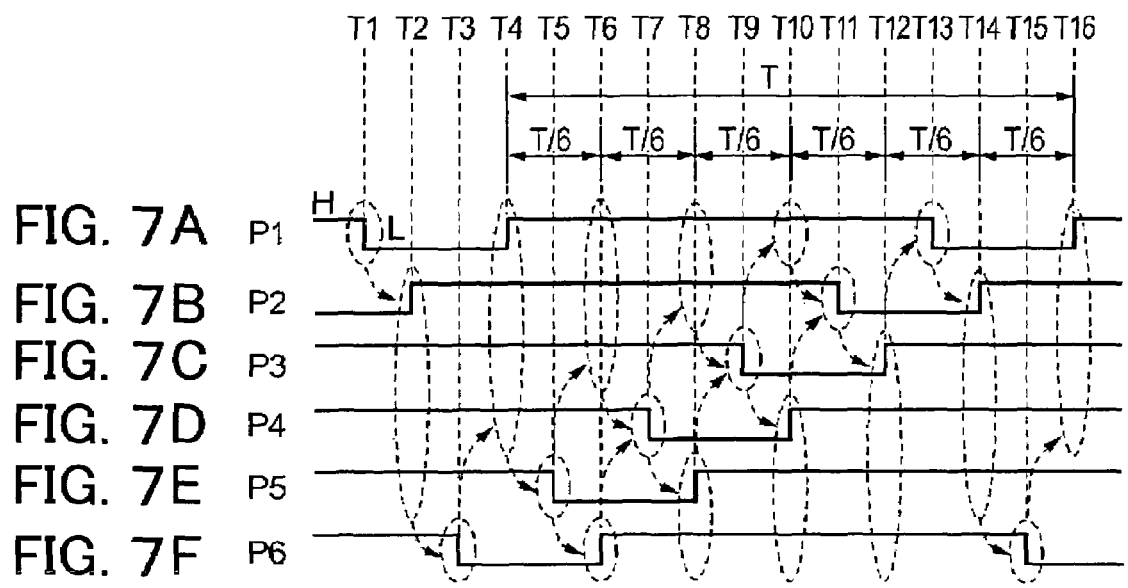
FIG. 7A P1
FIG. 7B P2
FIG. 7C P3
FIG. 7D P4
FIG. 7E P5
FIG. 7F P6
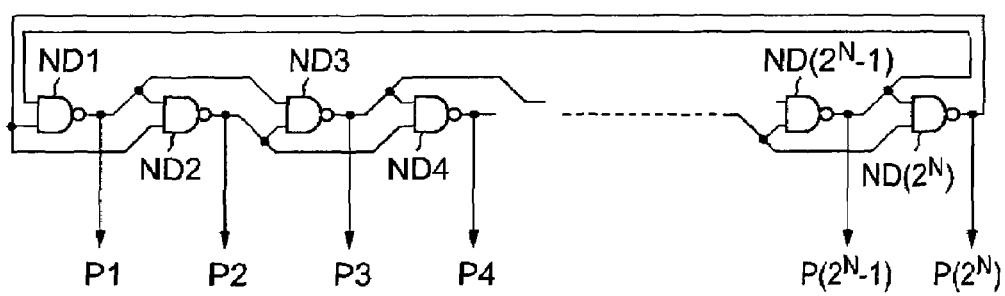
FIG. 8

8 PHASES OF CLOCKS

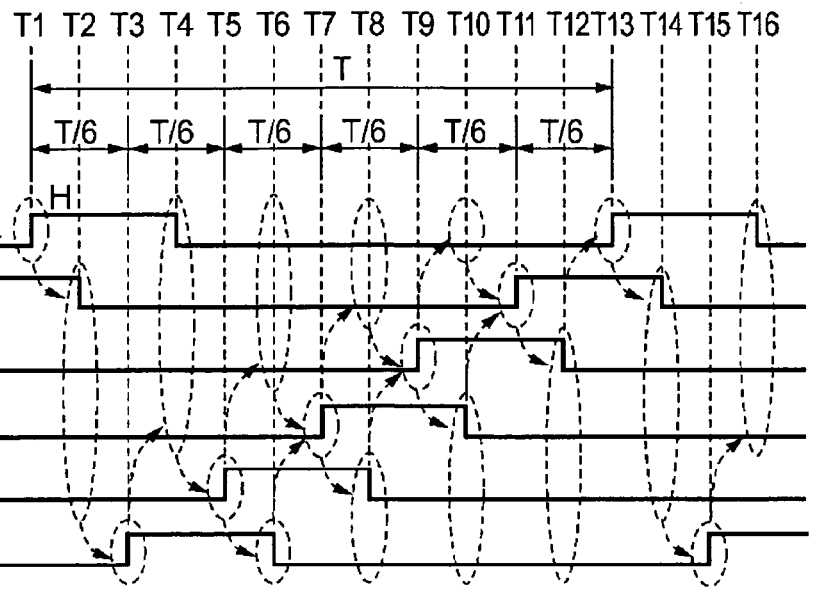
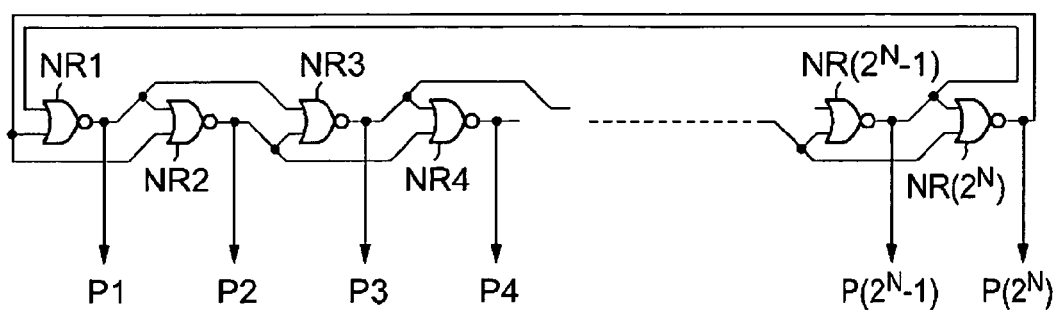
FIG. 13

OSCILLATOR

BACKGROUND OF THE INVENTION

1. Field of the Invention

The present invention relates to an oscillator.

2. Description of the Related Art

One of the methods employed in digital phase-locked loop (PLL) circuits is to select the optimum pulse from generated multiple phases of clock signals and use it as an output signal of the PLL circuit. In this case, if a difference arises in the phase differences between clock signals forming the multiple phases of clock signals, jitter of the output signal ends up increasing in accordance with the magnitude of the difference. Therefore, it is demanded that the phase difference be made constant with a high precision.

Further, processing for the selection is realized by a digital circuit, but when the number of phases of the multi-phase clock signals is an odd number, the arithmetic operations to be executed in the digital circuit become complex, so a processing circuit having a large circuit size is considered needed.

On the other hand, there is a ring oscillator used as a general clock signal generation circuit. The ring oscillator is comprised of an odd number of inverters connected in a ring. If connecting an even number of inverters in a ring at this time, the circuit becomes stable as a whole in state, so there is no oscillation. The number of phases of the multiple phases of clock signals obtained in a ring oscillator comprised of an odd number of inverters connected as described above is an odd number, and the phase difference between clock signals output from each inverter becomes one period of the odd number.

Here, Japanese Unexamined Patent Publication (Kokai) No. 6-216721 and Japanese Unexamined Patent Publication (Kokai) No. 7-283697 disclose oscillators each generating a plurality of signals having a phase difference of one period of the even number. However, these oscillators do not have symmetry in circuit configuration. At the same time, the number of pulses transmitted between devices forming the oscillators becomes one or two per unit period. From this, there is the problem that power supply noise is generated by fluctuation of the consumed current for every period in the oscillator, so a difference occurs in the phase difference between clock signals forming the multiple phases of clock signals.

By configuring the inverters as differential circuits, oscillation is also possible in a state with an even number of inverters connected. However, a ring oscillator using inverters as components is large in circuit size.

SUMMARY OF THE INVENTION

An object of the present invention is to provide an oscillator for generating an even number of phases of clock signals having a uniform phase difference with a high precision by a simple configuration.

The object of the invention is achieved by providing an oscillator comprising a plurality of logical circuits having the same number of input terminals connected in a ring, wherein an even number of the logical circuits are connected, and an output node of each logical circuit is connected to an input node of each logical circuit up to the logical circuit connected exactly the number of input terminals' worth of places ahead.

By such a means, the plurality of logical circuits can be made to output a plurality of clock signals having a uniform phase difference with a high precision.

Here, the oscillator oscillates conditional on the number of the logical circuits not being a multiple of the number of input terminals plus one. By making the number an even multiple of the greatest common divisor of the number of input terminals plus one, it can output an even number of phases of clock signals.

The logical circuits can comprise NAND circuits or NOR circuits.

BRIEF DESCRIPTION OF THE DRAWINGS

These and other objects and features of the present invention will become clearer from the following description of the preferred embodiments given with reference to the attached drawings, wherein:

FIG. 7, consisting of FIG. 7A through FIG. 7F, is a waveform diagram showing the operation of the oscillator shown in FIG. 6;

FIG. 8 is a view for explaining the configuration of an oscillator according to a fourth embodiment of the present invention;

FIG. 12, consisting of FIG. 12A through FIG. 12F is a waveform diagram showing the operation of the oscillator shown in FIG. 11; and FIG. 13 is a circuit diagram of the configuration of an oscillator according to a seventh embodiment of the present invention.

DESCRIPTION OF PREFERRED EMBODIMENTS

Figure 1:
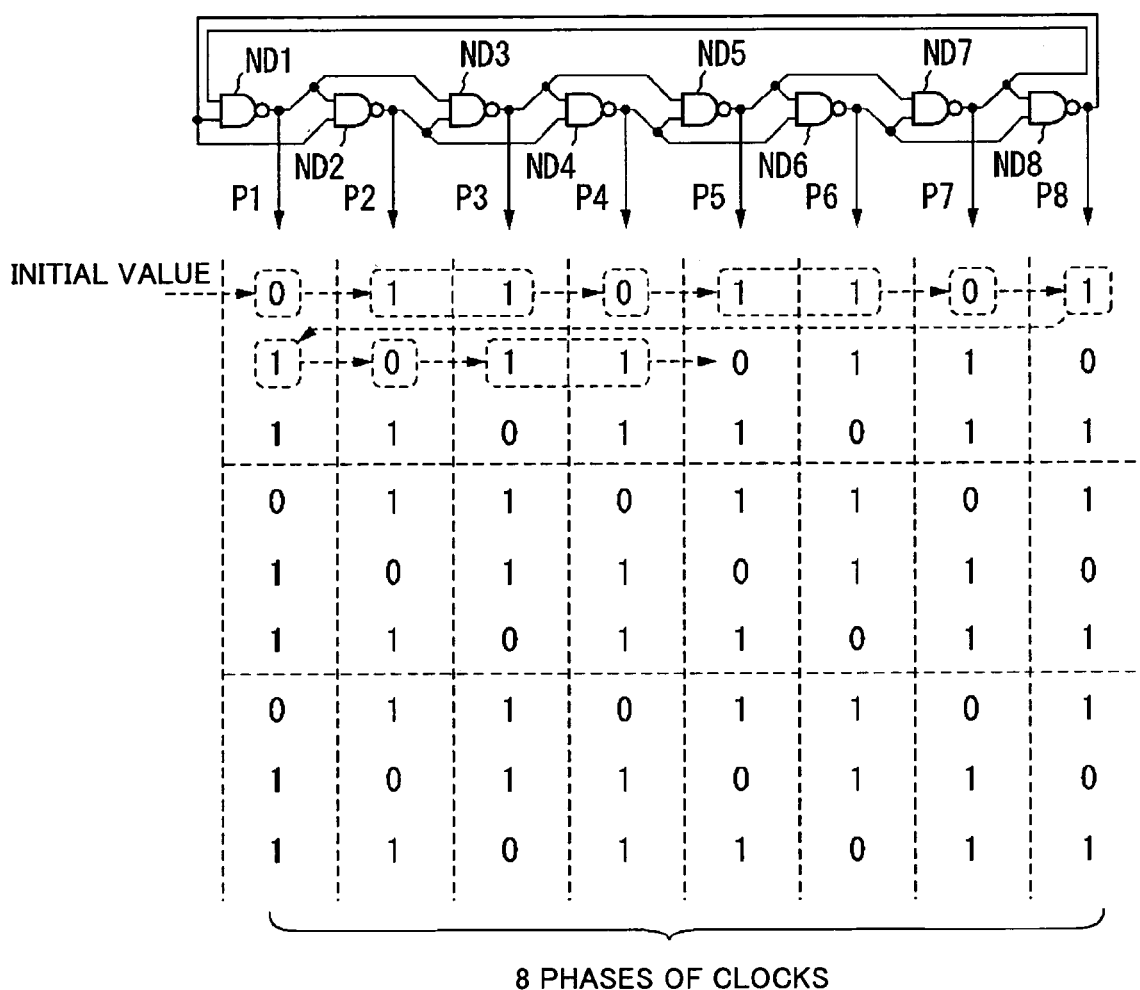
FIG. 1 is a view explaining the configuration of an oscillator according to a first embodiment of the present invention and the operation thereof.

Below, a detailed explanation will be given of embodiments of the present invention with reference to the drawings. Note that, in the drawings, the same notations indicate the same or corresponding parts.

The oscillator according to the present invention is a ring oscillator comprised of an even number of logical circuits such as NAND circuits connected in a ring, wherein the number of stages and the number of input terminals of the logical circuits can be suitably combined so as to realize generation of an even number of phases of clock signals having uniform phase differences with a high precision.

More specifically, the oscillator according to the present invention satisfies the following three conditions.

First, exactly an even number of four or more logical circuits such as NAND circuits having the same number of input terminals is connected in a ring, and the output node of each logical circuit is connected to the input node of each logical circuit up to the logical circuit exactly the number of input terminals' worth of places ahead.

Second, the number of stages of the logical circuits configuring the ring oscillator is controlled so as not to become a multiple of the number of input terminals of a logical circuit plus one.

Third, the number of stages is made an even multiple of the greatest common divisor of the number of input terminals of a logical circuit plus one and the number of stages.

Here, the second condition is the oscillation condition enabling an oscillator to oscillate without entering a stable state and is a condition required without regard as to whether the number of phases of the generated clock signals is odd or even.

Further, the third condition is the condition enabling an oscillator to generate an even number of phases of clock signals. The quotient obtained by dividing the number of stages by the greatest common divisor becomes the number of phases of the generated clock signals. Note that the quotient obtained by dividing the "number of input terminals plus one" by the greatest common divisor indicates the number of times a pulse signal passes through the ring during one period of the clock signal output from the ring oscillator.

Below, an explanation will be given of specific embodiments of the oscillator according to the present invention.

First Embodiment

FIG. 1 is a view for explaining the configuration of an oscillator according to a first embodiment of the present invention and the operation thereof. As shown in FIG. 1, the oscillator according to the first embodiment is formed by eight NAND circuits ND1 to ND8 sequentially connected in a ring. Clock signals P1 to P8 are output from the output nodes of the NAND circuits ND1 to ND8.

Here, in the oscillator shown in FIG. 1, eight NAND circuits each having two input terminals are connected in a ring. The output node of each of the NAND circuits ND1 to ND8 is connected to one input node of each of the NAND circuits up to the NAND circuit exactly the number of input terminals' worth of places, that is, two places, ahead.

Namely, for example, the output node of the NAND circuit ND1 is connected to one input node of the NAND circuit ND2 connected one place ahead and one input node of the NAND circuit ND3 connected two places ahead. In the same way, the output node of the NAND circuit ND8 is connected to one input node of the NAND circuit ND1 connected one place ahead and one input node of the NAND circuit ND2 connected two places ahead. By this, the oscillator shown in FIG. 1 satisfies the above first condition.

Next, in the ring oscillator shown in FIG. 1, since there are eight stages and the number of input terminals of the NAND circuits ND1 to ND8 plus one is three, the number of stages does not become a multiple of the number of input terminals plus one. It will be understood from this that the oscillator shown in FIG. 1 is a circuit satisfying the above second condition and performing an oscillation operation.

Further, in the ring oscillator shown in FIG. 1, since the greatest common divisor of the number of input terminals plus one and the number of stages becomes one, the number of stages becomes eight times the greatest common divisor, that is, an even multiple.

It will be understood from the above that the oscillator according to the first embodiment shown in FIG. 1 satisfies all of the first to third conditions.

Here, as seen also from the fact that the quotient obtained by dividing the number of stages by the greatest common divisor becomes eight, in the oscillator shown in FIG. 1, eight phases of clock signals are generated. Further, as seen also from the fact that the quotient obtained by dividing the number of input terminals plus one by the greatest common divisor is three, a pulse signal passes through the ring three times during one period of the output clock signal.

Below, an explanation will be given of the operation of the oscillator shown in FIG. 1. When a signal having a logic value of for example 0 is output from the NAND circuit ND1 in the initial state, the signal is output as the clock signal P1 from the oscillator and supplied to the NAND circuit ND2 and the NAND circuit ND3. Due to this, signals having the logic value "1" are output from the NAND circuit ND2 and the NAND circuit ND3. Accordingly, as shown in FIG. 1, a clock signal P2 and a clock signal P3 having the logic value "1" are output from the oscillator.

At this time, since signals having the logic value "1" are supplied from the NAND circuits ND2 and ND3 to the NAND circuit ND4, a signal having the logic value "0" is output from the NAND circuit ND4. Due to this, as shown in FIG. 1, a clock signal P4 having the logic value "0" is output from the oscillator.

Further, in the same way as the above, signals having the logic value "0" output from the NAND circuit ND4 are supplied to the NAND circuit ND5 and the NAND circuit ND6, so signals having the logic value "1" are output from the NAND circuit ND5 and the NAND circuit ND6. Due to this, clock signals P5 and P6 having the logic value "1" are output from the oscillator.

The NAND circuit ND7 is supplied with signals having the logic value "1" from the NAND circuits ND5 and ND6, so a signal having the logic value "0" is output. Due to this, a clock signal P7 having the logic value "0" is output from the oscillator.

Below, in the same way as above, clock signals P8 and P1 having the logic value "1" are output from the NAND circuit ND8 and the NAND circuit ND1, and the clock signal P2 having the logic value "0" is output from the NAND circuit ND2.

Accordingly, as shown in FIG. 1, the logic values of the clock signals P1 to P8 change along with time so as to sequentially repeat a pattern such as (0, 1, 1). Here, when the time during which the clock signal P1 to the clock signal P8 are sequentially generated is one cycle, the clock signal P1 having the logic value "0" as the initial value will be output from the NAND circuit ND1 again in the fourth cycle as shown in FIG. 1. Due to this, the output pattern from the first to the third cycle is repeated during the interval from the fourth cycle to the third cycle.

From the above description, the oscillator shown in FIG. 1 will generate the eight phases of clock signals P1 to P8 defining the above three cycles as one period and output the same.

Figure 2:
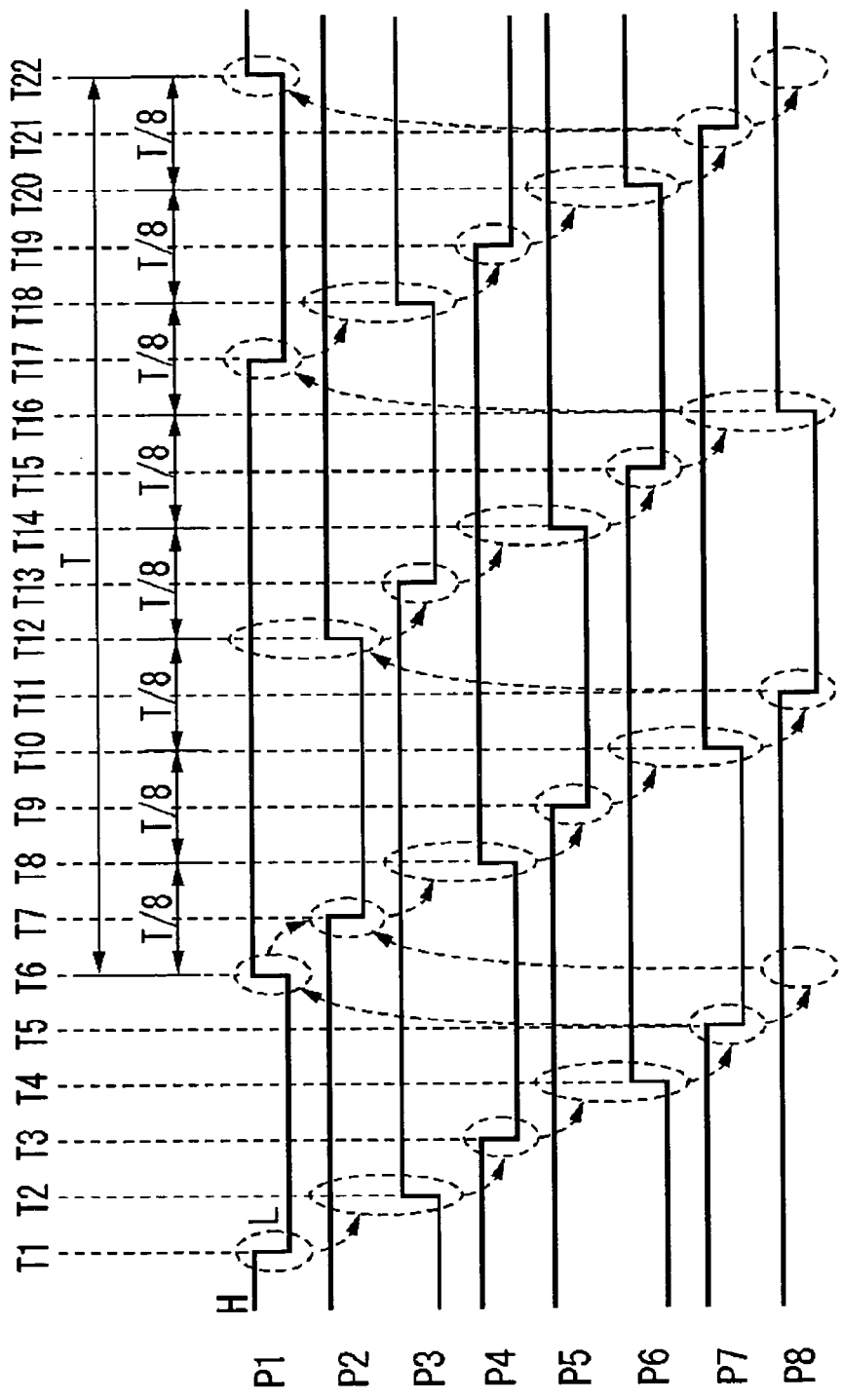
FIG. 2, consisting of FIG. 2A through 2H, is a waveform diagram showing the operation of the oscillator shown in FIG. 1.

Note that the timings of generation of the clock signals P1 to P8 are shown in FIGS. 2A to 2H. As shown in FIG. 2A, when the clock signal P1 shifts to the low level (L) having the logic value "0" at a time T1, as shown in FIG. 2C, the clock signal P3 output from the NAND circuit ND3 shifts to the high level (H) having the logic value "1" at a time T2. From this, the two signals input to the NAND circuit ND4 both become the high level, therefore, as shown in FIG. 2D, the clock-signal P4 shifts to the low level at a time T3. Then, as shown in FIG. 2F, the clock signal P6 shifts to the high level at a time T4.

At this time, the two signals input to the NAND circuit ND7 become the high level, therefore, as shown in FIG. 2G, the clock signal P7 shifts to the low level at a time T5. Due to this, a low level signal is supplied to the NAND circuit ND1. Therefore, as shown in FIG. 2A, the clock signal P1 shifts to the high level at a time T6.

Then, the two signals input to the NAND circuit ND2 become the high level, therefore, as shown in FIG. 2B, the clock signal P2 shifts to the low level at a time T7.

Below, in the same way as above, the levels of the clock signals P1 to P8 sequentially shift at predetermined timings as shown in FIGS. 2A to 2H. Then, of the interval of one period T from the time T6 to a time T22 during which for example the clock signal P1 shifts from the low level to the high level, the clock signals P4, P7, P2, P5, P8, P3, and P6 sequentially shift from the low level to the high level at every period (T/8). From this, the oscillator according to the first embodiment can generate an even number of phases of clock signals having a uniform phase difference with a high precision.

Figure 3:
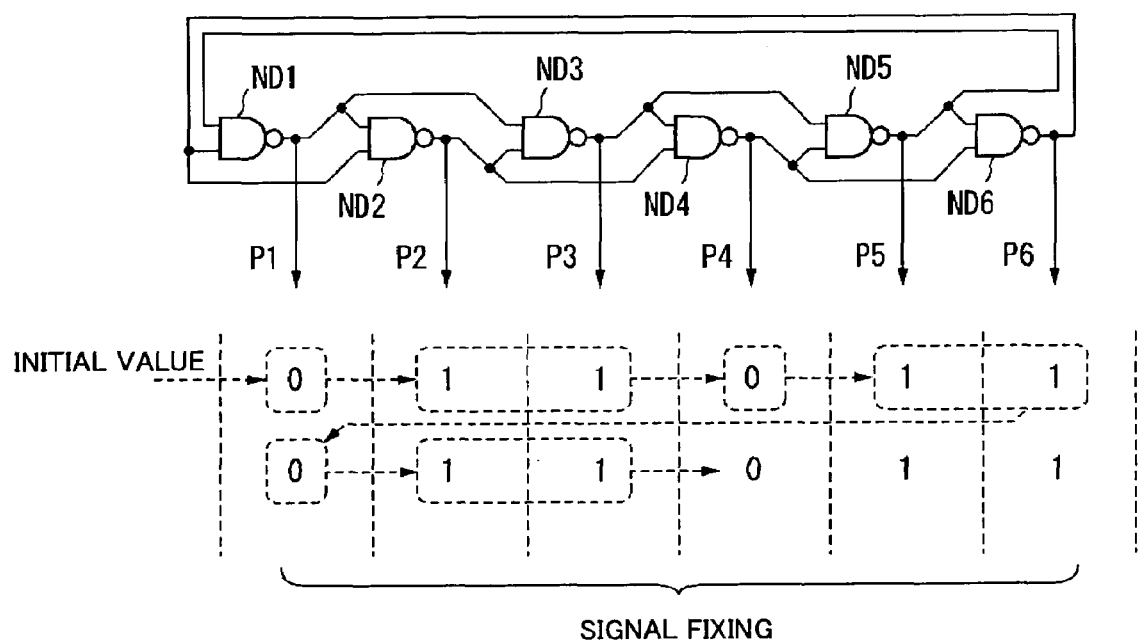
FIG. 3 is a view explaining the configuration of an oscillator not satisfying oscillation requirements according to an embodiment of the present invention and the operation thereof.

FIG. 3 shows an example of an oscillator not satisfying the above second condition (oscillation condition). The oscillator shown in FIG. 3 includes two-input NAND circuits ND1 to ND6 connected in a ring. Here, the output node of the NAND circuit ND1 is connected to one input node of the NAND circuit ND2 and one input node of the NAND circuit ND3, the output node of the NAND circuit ND2 is connected to one input node of the NAND circuit ND3 and one input node of the NAND circuit ND4, and the output node of the NAND circuit ND3 is connected to one input node of the NAND circuit ND4 and one input node of the NAND circuit ND5. Further, the output node of the NAND circuit ND4 is connected to one input node of the NAND circuit ND5 and one input node of the NAND circuit ND6, the output node of the NAND circuit ND5 is connected to one input node of the NAND circuit ND6 and one input node of the NAND circuit ND1, and the output node of the NAND circuit ND6 is connected to one input node of the NAND circuit ND1 and one input node of the NAND circuit ND2.

In the oscillator shown in FIG. 3 having the configuration as described above, there are six logical circuits (NAND circuits) configuring the ring oscillator. The number of input terminals of the logical circuit plus one is three. Accordingly, the number of stages becomes a multiple of the number of input terminals plus one and does not satisfy the oscillation requirements, so the oscillator shown in FIG. 3 does not oscillate.

Namely, as shown in FIG. 3, when a signal of for example the logic value "0" is output from the NAND circuit ND1 in the initial state, the signal is output as the clock signal P1 from the oscillator and supplied to the NAND circuit ND2 and the NAND circuit ND3. Due to this, a signal having the logic value "1" is output from the NAND circuit ND2 and the NAND circuit ND3. Accordingly, as shown in FIG. 3, the clock signal P2 and the clock signal P3 having the logic value "1" are output from the oscillator.

At this time, the NAND circuit ND4 is supplied by signals having the logic value "1" from the NAND circuits ND2 and ND3, so a signal having the logic value "0" is output from the NAND circuit ND4. Due to this, as shown in FIG. 3, the clock signal P4 having the logic value "0" is output from the oscillator. Further, in the same way as the above, a signal having the logic value "0" output from the NAND circuit ND4 is supplied to the NAND circuit ND5 and the NAND circuit ND6, so signals having the logic value "1" are output from the NAND circuit ND5 and the NAND circuit ND6. Due to this, the clock signals P5 and P6 having the logic value "1" are output from the oscillator.

Further, the NAND circuit ND1 is supplied with signals having the logic value "1" from the NAND circuits ND5 and ND6, so a signal having the logic value "0" is output again from the NAND circuit ND1. It will be understood from this that the NAND circuits ND1 to ND6 repeat the above operation shown in FIG. 3.

Accordingly, in the oscillator shown in FIG. 3, the logic values of the clock signals P1 to P6 are fixed, so the oscillation operation is not realized.

From the above, according to the oscillator according to first embodiment of the present invention, the even number of phases (eight phases) of clock signals P1 to P8 having a uniform phase difference with a high precision can be generated by a simple configuration. Therefore, the circuit size of a digital PLL circuit including the oscillator can be reduced. At the same time, the power consumption of the digital PLL circuit is reduced, and the amount of increase of jitter of the clock signal output from the digital PLL circuit can be suppressed.

Second Embodiment

Figure 4:
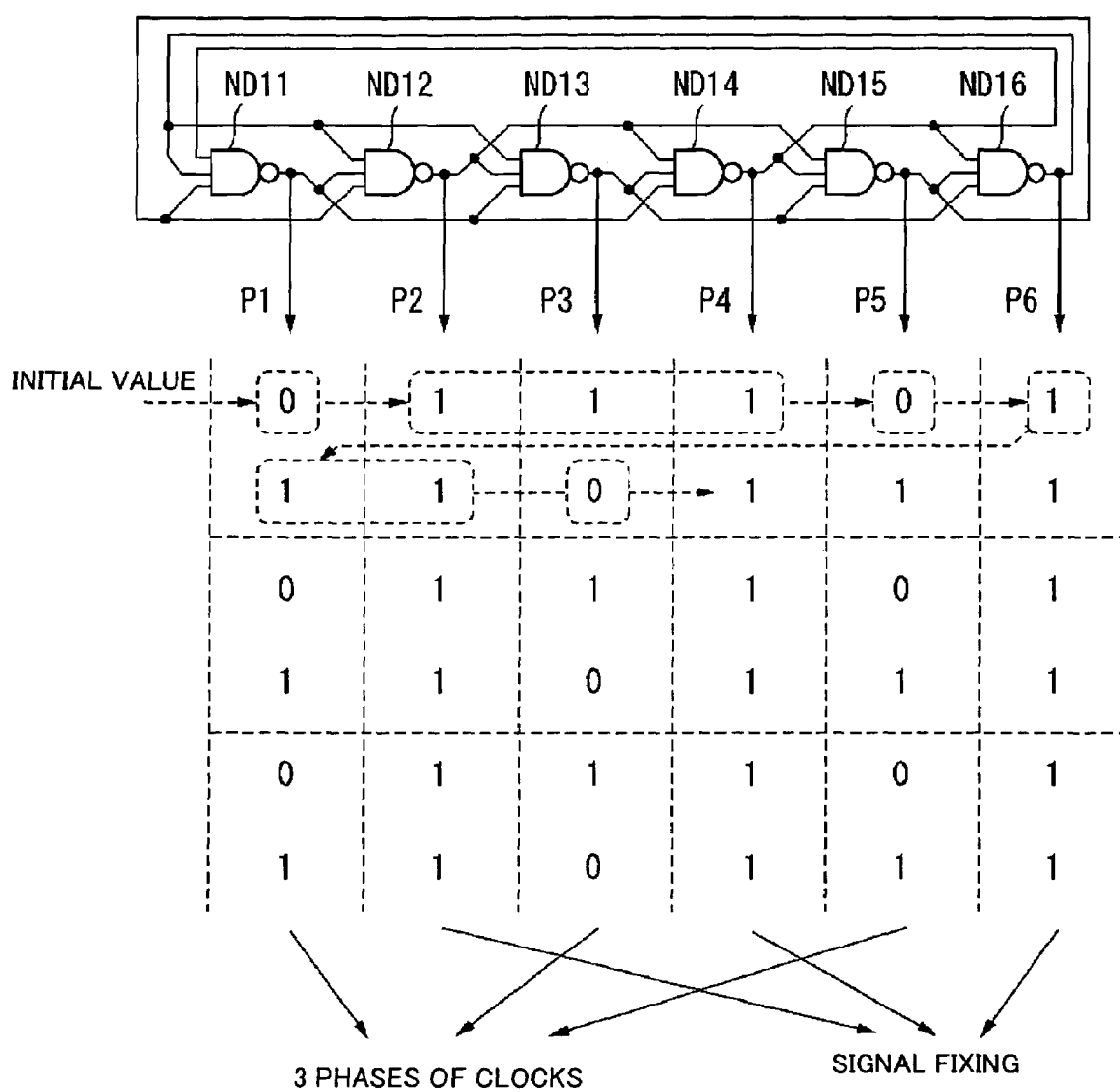
FIG. 4 is a view for explaining the configuration of an oscillator according to a second embodiment of the present invention and the operation thereof.

FIG. 4 is a view for explaining the configuration of an oscillator according to a second embodiment of the present invention and the operation thereof. As shown in FIG. 4, the oscillator according to the second embodiment is formed by six NAND circuits ND11 to ND16 sequentially connected in a ring. Clock signals P1 to P6 are output from the output nodes of the NAND circuits ND11 to ND16.

Here, in the oscillator shown in FIG. 4, six NAND circuits each having three input terminals are connected in a ring. The output node of each of the NAND circuits ND11 to ND16 is connected to the input node of each of the NAND circuits up to the NAND circuit exactly the number of input terminals' worth of places, that is, three places, ahead.

Namely, for example, the output node of the NAND circuit ND11 is connected to one input node of the NAND circuit ND12 connected one place ahead, one input node of the NAND circuit ND13 connected two places ahead, and one NAND circuit ND14 connected three places ahead. In the same way as above, the output node of the NAND circuit ND16 is connected to one input node of the NAND circuit ND11 connected one place ahead, one input node of the NAND circuit ND12 connected two places ahead, and one NAND circuit ND13 connected three places ahead. Due to this, the oscillator shown in FIG. 4 satisfies the above first condition.

Next, in the ring oscillator shown in FIG. 4, since there are six stages and the number of input terminals plus one of the NAND circuits ND11 to ND16 becomes four, the number of stages does not become a multiple of the number of input terminals plus one. It will be understood from this that the oscillator shown in FIG. 4 is a circuit satisfying the above second condition and performing an oscillation operation.

Further, in the ring oscillator shown in FIG. 4, the greatest common divisor of the number of input terminals plus one and the number of stages becomes two, so the number of stages becomes three times of the greatest common divisor, that is, an odd multiple.

It will be understood from the above that the oscillator according to the second embodiment shown in FIG. 4 satisfies the first and second conditions, but does not satisfy the third condition. For this reason, the oscillator according to the second embodiment becomes one for generating an odd number of phases of clock signals.

Specifically, since the quotient obtained by dividing the number of stages by the greatest common divisor becomes three, three phases of clock signals are generated in the oscillator shown in FIG. 4. Further, as will be understood also from the fact that the quotient obtained by dividing the number of input terminals plus one by the greatest common divisor is two, a pulse passes through the ring exactly two times during the interval of one period of the output clock signal.

Below, an explanation will be given of the operation of the oscillator shown in FIG. 4. When a signal having a logic value of for example "0" is output from the NAND circuit ND11 in the initial state, the signal is output as the clock signal P1 from the oscillator and supplied to the NAND circuit ND12, the NAND circuit ND13, and the NAND circuit ND14. Due to this, signals having the logic value of "1" are output from the NAND circuit ND12, the NAND circuit ND13, and the NAND circuit ND14. Accordingly, as shown in FIG. 4, the clock signal P2, the clock signal P3, and the clock signal P4 having the logic value "1" are output from the oscillator.

At this time, the NAND circuit ND15 is supplied with signals having the logic value "1" are supplied from the NAND circuits ND12 to ND14, so a signal having the logic value "0" is output from the NAND circuit ND15. By this, as shown in FIG. 4, the clock signal P5 having the logic value "0" is output from the oscillator.

Further, in the same way as the above, a signal having the logic value "0" output from the NAND circuit ND15 is supplied to the NAND circuit ND16, the NAND circuit ND11, and the NAND circuit ND12, so signals having the logic value "1" are output from the NAND circuit ND16, the NAND circuit ND11, and the NAND circuit ND12. Due to this, the clock signals P6, P1, and P2 having the logic value "1" are output from the oscillator.

Then, further, the NAND circuit ND13 is supplied with signals having the logic value "1" from the NAND circuits ND16, ND11, and ND12, so a signal having the logic value "0" is output. Due to this, the clock signal P3 having the logic value "0" is output from the oscillator.

Below, in the same way as above, clock signals P4 to P6 having the logic value "1" are output from the NAND circuits ND14 to ND16, and the clock signal P1 having the logic value "0" is output again from the NAND circuit ND11.

Accordingly, as shown in FIG. 4, the logic values of the clock signals P1 to P6 change along with time so as to sequentially repeat a pattern such as (0, 1, 1, 1). Here, when a time during which the clock signal P1 to the clock signal P6 are sequentially generated is one cycle, the clock signal P1 having the logic value "0" as the initial value will be output from the NAND circuit ND11 again in the third cycle as shown in FIG. 4. Due to this, the output pattern up to the second cycle is repeated in the interval from the third cycle to the second cycle.

Here, as shown in FIG. 4, the logic levels of the clock signals P2, P4, and P6 always become "1" or are fixed, so the present oscillator is regarded as generating and outputting three phases of clock signals by the clock signals P1, P3, and P5.

Figure 5:
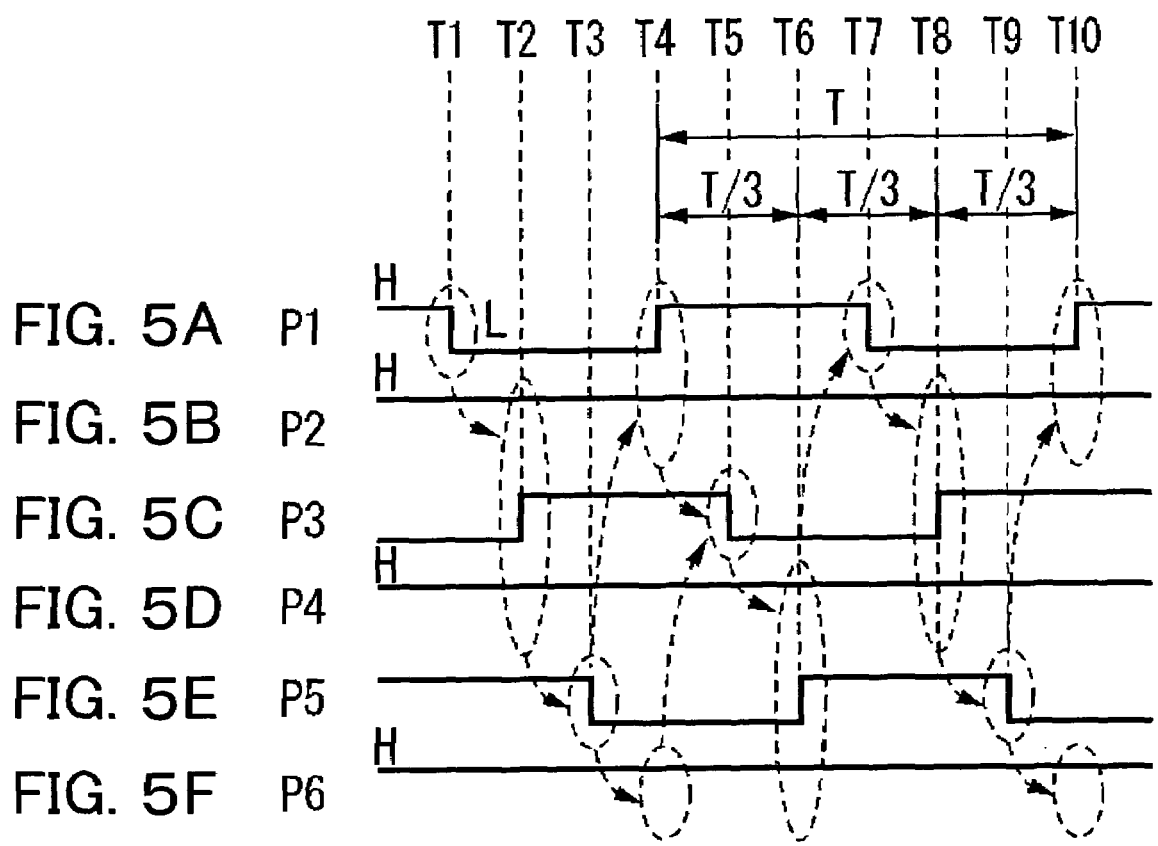
FIG. 5, consisting of FIG. 5A through FIG. 5F, is a waveform diagram showing the operation of the oscillator shown in FIG. 4.

Note that the timings of generation of the clock signals P1 to P6 are shown in (a) to (f) of FIG. 5. As shown in (a), when the clock signal P1 shifts to the low level (L) at the time T1, as shown in (c), the clock signal P3 output from the NAND circuit ND13 shifts to the high level (H) at the time T2. From this, all of the three signals input to the NAND circuit ND15 become the high level, therefore, as shown in (e), the clock signal P5 shifts to the low level at the time T3. Then, as shown in (a), the clock signal P1 shifts to the high level at the time T4.

At this time, all of the three signals input to the NAND circuit ND13 become the high level, therefore, as shown in (c), the clock signal P3 shifts to the low level at the time T5. Due to this, a signal of the low level is supplied to the NAND circuit ND15, therefore, as shown in (e), the clock signal P5 shifts to the high level at the time T6.

Then, all of the three signals input to the NAND circuit ND1 become the high level, therefore, as shown in (a), the clock signal P1 shifts to the low level at the time T7.

Below, in the same way as above, the levels of the clock signals P1 to P6 sequentially shift at predetermined timings as shown in (a) to (f) of FIG. 5. Then, during one period T from the time T4 to the time T10 during which for example the clock signal P1 shifts from the low level to the high level, the clock signals P5 and P3 sequentially shift from the low level to the high level every period (T/3).

From the above, by the oscillator according to second embodiment of the present invention, the three phases of the clock signals P1, P3, and P5 having a uniform phase difference with a high precision can be generated by a simple configuration.

Third Embodiment

Figure 6:
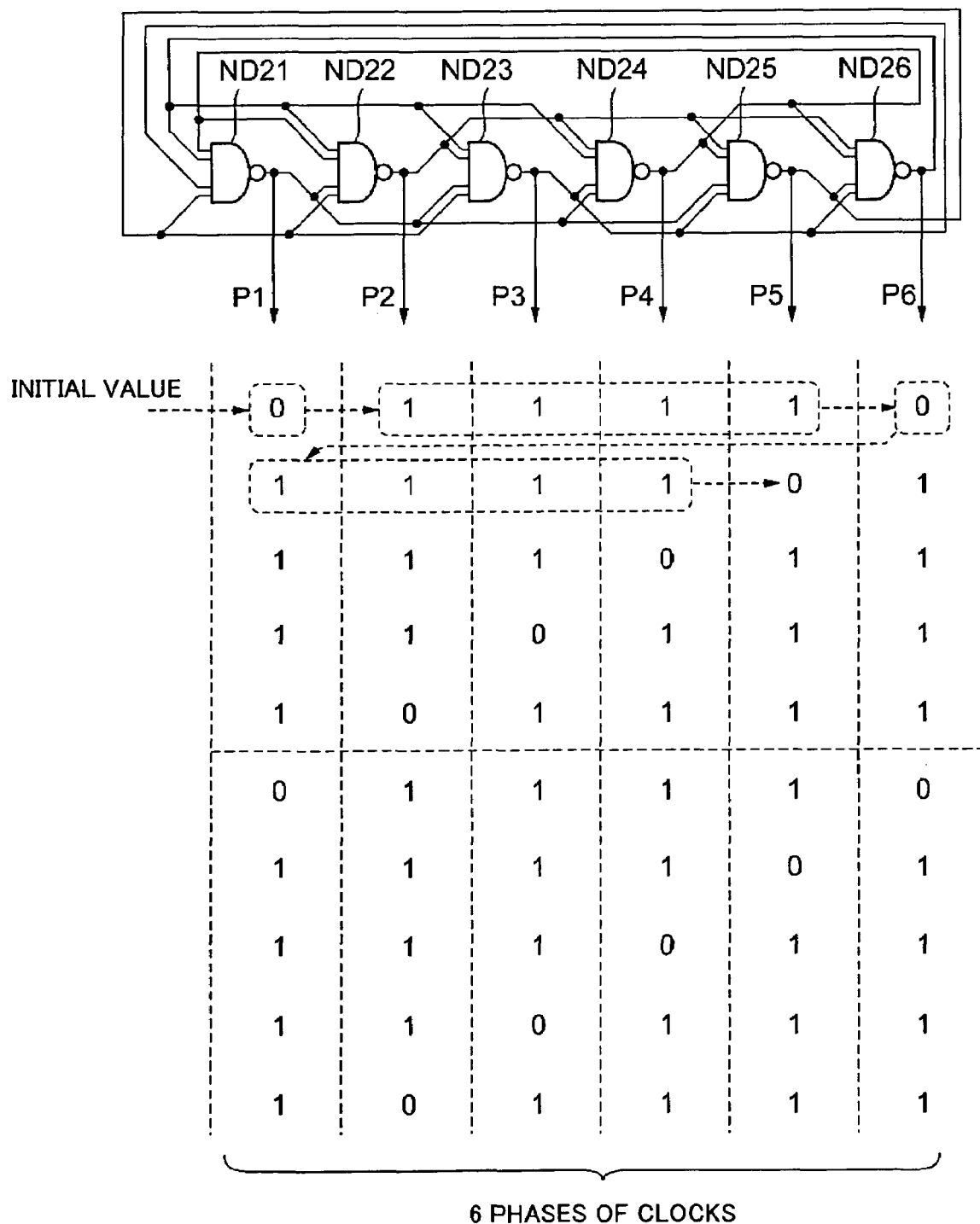
FIG. 6 is a view for explaining the configuration of an oscillator according to a third embodiment of the present invention and the operation thereof.

FIG. 6 is a view for explaining the configuration of an oscillator according to a third embodiment of the present invention and the operation thereof. As shown in FIG. 6, the oscillator according to the third embodiment is formed by six NAND circuits ND21 to ND26 sequentially connected in a ring. Clock signals P1 to P6 are output from the output nodes of the NAND circuits ND21 to ND26.

Here, in the oscillator shown in FIG. 6, six NAND circuits each having four input terminals are connected in a ring. The output node of each of the NAND circuits ND21 to ND26 is connected to the input node of each of the NAND circuits up to the NAND circuit exactly the number of input terminals' worth of places, that is, four places, ahead.

Namely, for example, the output node of the NAND circuit ND21 is connected to one input node of the NAND circuit ND22 connected one place ahead, one input node of the NAND circuit ND23 connected two places ahead, the NAND circuit ND24 connected three places ahead, and the NAND circuit ND25 connected four places ahead. In the same way as the above, the output node of the NAND circuit ND26 is connected to one input node of the NAND circuit ND21 connected one place ahead, one input node of the NAND circuit ND22 connected two places ahead, one input node of the NAND circuit ND23 connected three places ahead, and one input node of the NAND circuit ND24 connected four places ahead. Due to this, the oscillator shown in FIG. 6 satisfies the above first condition.

Next, in the ring oscillator shown in FIG. 6, there are six stages and the number of input terminals plus one of the NAND circuits ND21 to ND26 becomes five, so the number of stages does not become a multiple of the number of input terminals plus one. It will be understood from this that the oscillator shown in FIG. 6 is a circuit satisfying the above second condition and performing an oscillation operation.

Further, in the ring oscillator shown in FIG. 6, the greatest common divisor of the number of input terminals plus one and the number of stages becomes one, so the number of stages becomes six times the greatest common divisor or an even multiple.

It will be understood from the above that the oscillator according to the second embodiment shown in FIG. 6 satisfies the first to third conditions.

Here, since the quotient obtained by dividing the number of stages by the greatest common divisor becomes six, in the oscillator shown in FIG. 6, six phases of clock signals are generated. Further, as seen also from the fact that the quotient obtained by dividing the number of input terminals plus one by the greatest common divisor is five, the pulse signal passes through the ring five times during the interval of one period of the output clock signal.

Below, an explanation will be given of the operation of the oscillator shown in FIG. 6. When a signal having a logic value of for example "0" is output from the NAND circuit ND21 in the initial state, the signal is output as the clock signal P1 from the oscillator and supplied to the NAND circuit ND22 to the NAND circuit ND25. Due to this, a signal having the logic value "1" is output from the NAND circuit ND22 to the NAND circuit ND25. Accordingly, as shown in FIG. 6, clock signals P2 to P5 having the logic value "1" are output from the oscillator.

At this time, the NAND circuit ND26 is supplied with signals having the logic value "1" from the NAND circuits ND22 to ND25, so a signal having the logic value "0" is output from the NAND circuit ND26. Due to this, as shown in FIG. 6, the clock signal P6 having the logic value "0" is output from the oscillator.

Further, in the same way as the above, a signal having the logic value "0" output from the NAND circuit ND26 is supplied to the NAND circuit ND21 to the NAND circuit ND24, so signals having the logic value "1" are output from all of the NAND circuits ND21 to ND24. Due to this, clock signals P1 to P4 having the logic value "1" are output from the oscillator.

Further, the NAND circuit ND25 is supplied with signals having the logic value "1" from the NAND circuits ND21 to ND24, so a signal having the logic value "0" is output. Due to this, the clock signal P5 having the logic value "0" is output from the oscillator.

Accordingly, as shown in FIG. 6, the logic values of the clock signals P1 to P6 change along with time so as to sequentially repeat a pattern such as (0, 1, 1, 1, 1). Here, when the time during which the clock signal P1 to the clock signal P6 are sequentially generated is one cycle, the clock signal P1 having the logic value "0" as the initial value will be output from the NAND circuit ND21 again in the sixth cycle as shown in FIG. 6. Due to this, the output pattern up to the fifth cycle is repeated in the interval from the sixth cycle to the fifth cycle.

Note that the timings of generation of the clock signals P1 to P6 are shown in (a) to (f) of FIG. 7. As shown in (a), when the clock signal P1 shifts to the low level (L) at the time T1, as shown in (b), the clock signal P2 output from the NAND circuit ND22 shifts to the high level (H) at the time T2. Due to this, all of the four signals input to the NAND circuit ND26 become the high level. Therefore, as shown in (f), the clock signal P6 shifts to the low level at the time T3. Then, as shown in (a), the clock signal P1 shifts to the high level at the time T4.

At this time, all of the four signals input to the NAND circuit ND25 become the high level. Therefore, as shown in (e), the clock signal P5 shifts to the low level. at the time T5. Due to this, a signal of the low level is supplied to the NAND circuit ND26. Therefore, as shown in (f), the clock signal P6 shifts to the high level at the time T6.

Then, all of the four signals input to the NAND circuit ND24 become the high level. Therefore, as shown in (d), the clock signal P4 shifts to the low level at the time T7.

Below, in the same way as above, as shown in (a) to (f) of FIG. 7, the levels of the clock signals P1 to P6 sequentially shift at the predetermined timings. Then, for example, in the interval of one period T from the time T4 to the time T16 during which for example the clock signal P1 shifts from the low level to the high level, the clock signals P6, P5, P4, P3, and P2 sequentially shift from the low level to the high level every period (T/6).

From the above, by the oscillator according to the third embodiment of the present invention, the even number of phases (six phases) of clock signals P1 to P6 having a uniform phase difference with a high precision can be generated by a simple configuration, and the same effects as those by the oscillator according to above first embodiment can be obtained.

Fourth Embodiment

FIG. 8 is a circuit diagram showing the configuration of the oscillator according to a fourth embodiment of the present invention. As shown in FIG. 8, the oscillator according to the fourth embodiment of the present invention is formed by ($2^N$) number of NAND circuits ND1 to ND($2^N$) sequentially connected in a ring. Clock signals P1 to P($2^N$) are output from the output nodes of the NAND circuits ND1 to ND($2^N$). Note that the above "N" is defined as an integer of two or more.

Here, in the oscillator shown in FIG. 8, ($2^N$) number of NAND circuits each having two input terminals are connected in a ring. The output node of each of the NAND circuits ND1 to ND($2^N$) is connected to one input node of each of the NAND circuits up to the NAND circuit the number of input terminals' worth of places, that is, two places, ahead.

Namely, for example, the output node of the NAND circuit ND1 is connected to one input node of the NAND circuit ND2 connected one place ahead and one input node of the NAND circuit ND3 connected two places ahead. In the same way as above, the output node of the NAND circuit ND($2^N$) is connected to one input node of the NAND circuit ND1 connected one place ahead and one input node of the NAND circuit ND2 connected two places ahead. Due to this, the oscillator shown in FIG. 8 satisfies the above first condition.

Next, in the ring oscillator shown in FIG. 8, there are ($2^N$) number of stages, and the number of input terminals plus one of the NAND circuits ND1 to ND($2^N$) becomes three, so the number of stages does not become a multiple of the number of input terminals plus one. It will be understood from this that the oscillator shown in FIG. 8 is a circuit satisfying the second condition and performing an oscillation operation.

Further, in the ring oscillator shown in FIG. 8, the greatest common divisor of the number of input terminals plus one and the number of stages becomes one, so the number of stages becomes ($2^N$) times the greatest common divisor or an even multiple.

From the above, the oscillator according to the fourth embodiment shown in FIG. 8 satisfies all of the first to third conditions and exhibits the same effects as those by the oscillator according to above first embodiment.

Note that, since the quotient obtained by dividing the number of stages by the greatest common divisor becomes ($2^N$), in the oscillator shown in FIG. 8, ($2^N$) phases of clock signals are generated. Further, the quotient obtained by dividing the number of input terminals plus one by the greatest common divisor is three, so it will be understood that the pulse signal passes through the ring exactly three times in the interval of one period of the output clock signal.

The above description was given of oscillators according to embodiments of the present invention configured by using NAND circuits. The following Table 1 summarizes examples of the configuration of oscillators configured by NAND circuits for generating an even number of phases of clock signals where the number of ring stages and the number of phases of the clock signals match

TABLE 1

| Name of ring stages (number of clock phases) | Number of NAND input terminals + 1 | Number of NAND input terminals |
|---|---|---|
| 4 (= $2^2$) | 3 | 2 |
| 6 (= 2 × 3) | 5 | 4 |
| 8 (= $2^3$) | 3 | 2 |
| 10 (= 2 × 5) | 3 | 2 |
| 12 (= $2^2$ × 3) | 5 | 4 |
| 14 (= 2 × 7) | 3 | 2 |
| 16 (= $2^4$) | 3 | 2 |
| 18 (= 2 × $3^2$) | 5 | 4 |
| 20 (= $2^2$ × 5) | 3 | 2 |
| 22 (= 2 × 11) | 3 | 2 |
| 24 (= $2^3$ × 3) | 5 | 4 |
| 26 (= 2 × 13) | 3 | 2 |
| 28 (= $2^2$ × 7) | 3 | 2 |
| 30 (= 2 × 3 × 5) | 7 | 6 |
| 32 (= $2^5$) | 3 | 2 |

Note that Table 1 shows combinations of the number of input terminals of the NAND circuits and the number of ring stages for realizing oscillators satisfying the first to third conditions by the simplest configuration. For example, the first embodiment corresponds to the case where the number of input terminals is two and the number of ring stages is eight, while the third embodiment corresponds to the case where the number of input terminals is four and the number of ring stages is six.

Here, the combination is selected so that the (number of input terminals+1) shown at the center of Table 1 becomes the smallest prime number other than the factor of the number of ring stages shown at the left end.

Fifth Embodiment

All of the oscillators according to the first to fourth embodiments were configured by using NAND circuits, but it is also possible to configure the oscillator according to the present invention by other logical circuits. Namely, even if replacing the NAND circuits in the above embodiments by NOR circuits by for example De Morgan's rule, oscillators exhibiting the same action and effects can be realized. Below, a concrete example will be explained.

Figure 9:
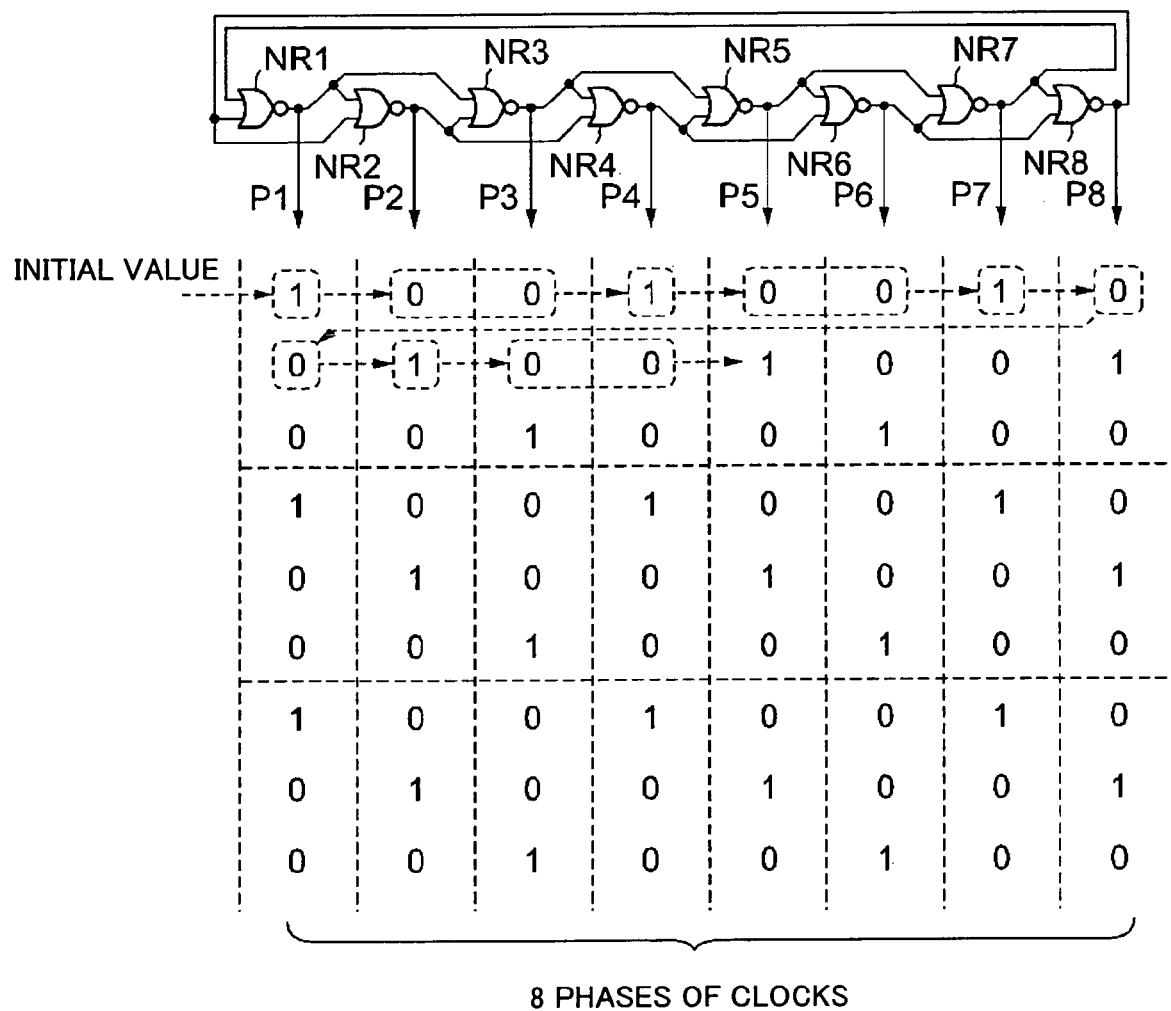
FIG. 9 is a view for explaining the configuration of an oscillator according to a fourth embodiment of the present invention and the operation thereof.

FIG. 9 is a view of the configuration of an oscillator according to a fifth embodiment obtained by replacing the NAND circuits ND1 to ND8 shown in FIG. 1 by NOR circuits NR1 to NR8 and the operation thereof. In FIG. 9, the operation in the case where the clock signal P1 having the logic value "1" is output from the NOR circuit NR1 as the initial value is shown.

Figure 10:
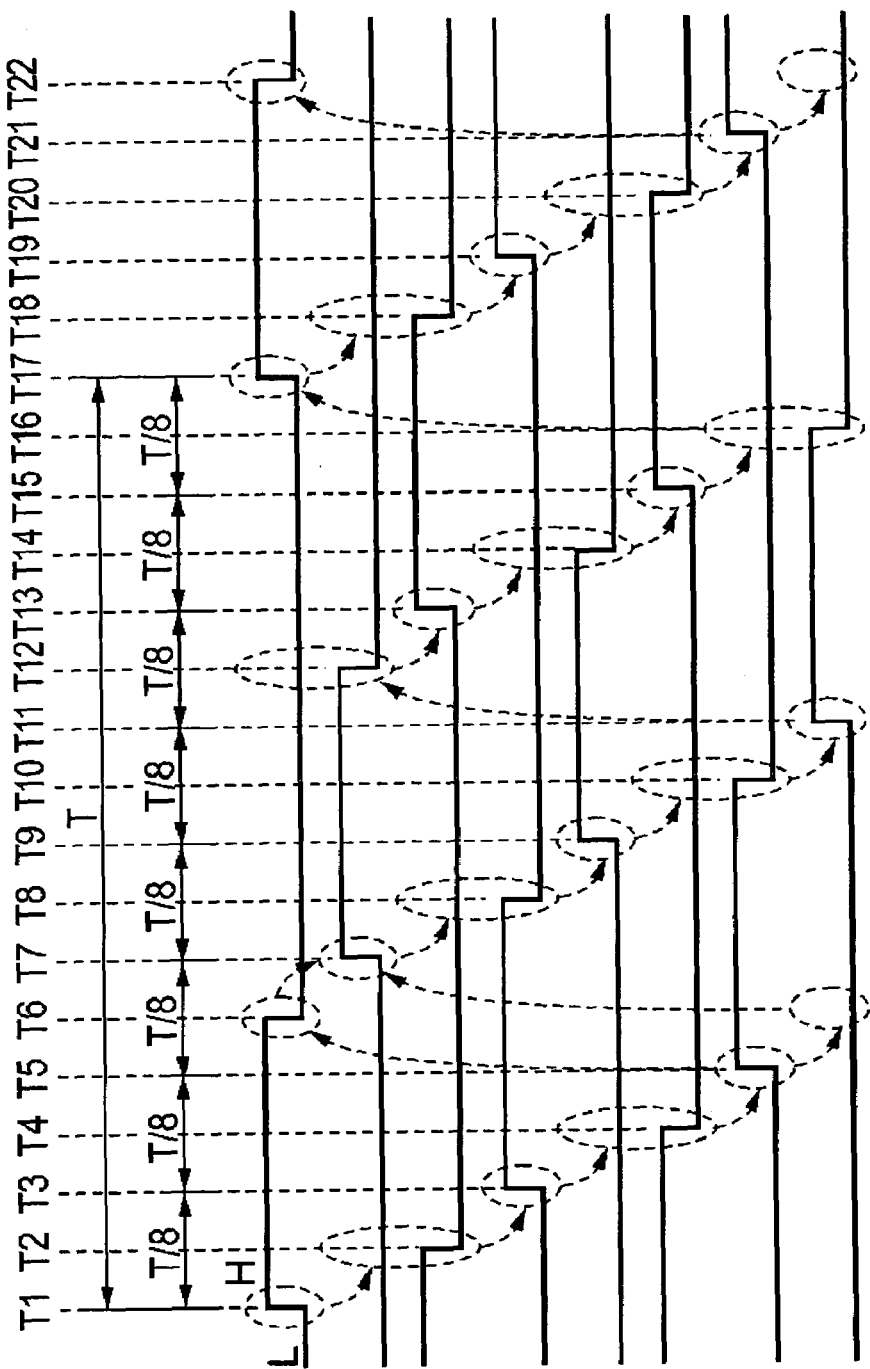
FIG. 10, consisting of FIG. 10A through FIG. 10H, is a waveform diagram showing the operation of the oscillator shown in FIG. 9.

FIG. 10 shows the changes along with time of the clock signals P1 to P8 output from the NOR circuits NR1 to NR8 shown in FIG. 9.

Accordingly, as shown in FIG. 9 and FIG. 10, the oscillator according to the fifth embodiment operates in the same way as the oscillator according to the first embodiment, so effects the same as those by the oscillator according to first embodiment can be obtained.

Sixth Embodiment

Figure 11:
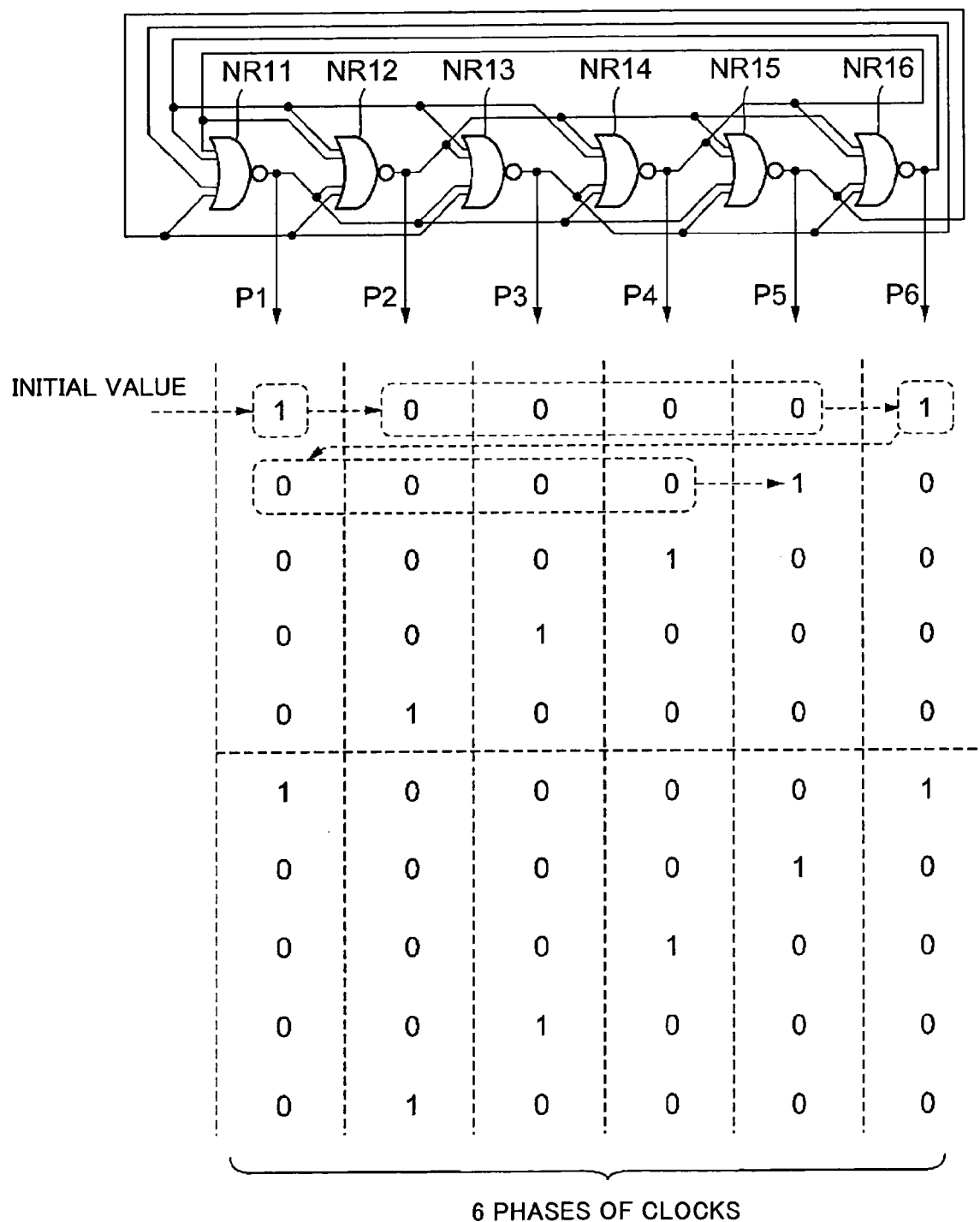
FIG. 11 is a view for explaining the configuration of an oscillator according to a sixth embodiment of the present invention and the operation thereof.

FIG. 11 is a view of the configuration of an oscillator according to a sixth embodiment obtained by replacing the NAND circuits ND21 to ND26 shown in FIG. 6 by the NOR circuits NR11 to NR16 and the operation thereof. FIG. 11 shows the operation in the case where the clock signal P1 having the logic value "1" is output as the initial value from the NOR circuit NR11.

Further, FIG. 12 shows the changes along with time of the clock signals P1 to P5 output from the NOR circuits NR11 to NR16 shown in FIG. 11.

Accordingly, as shown in FIG. 11 and FIG. 12, the oscillator according to the sixth embodiment operates in the same way as the oscillator according to the third embodiment, so the same effects as those by the oscillator according to the third embodiment can be obtained.

Seventh Embodiment

FIG. 13 is a circuit diagram showing the configuration of an oscillator according to a seventh embodiment obtained by replacing the NAND circuits ND1 to ND($2^N$) shown in FIG. 8 by the NOR circuits NR1 to NR($2^N$). Note that the above "N" is an integer of 2 or more.

The oscillator according to the seventh embodiment operates in the same way as the oscillator according to the fourth embodiment, and the same effects as those by the oscillator according to the fourth embodiment can be obtained.

Summarizing the effects of the invention, by the oscillator according to the present invention, a plurality of phases of clock signals having a uniform phase difference can be obtained with a high precision by a simple configuration.

Here, by making the number of the logical circuits configuring the oscillator not a multiple of the number of input terminals plus one, but an even multiple of the greatest common divisor of the number of input terminals plus one and the number of the logical circuits, an even number of phases of clock signals having a uniform phase difference can be easily obtained with a high precision.

While the invention has been described with reference to specific embodiments chosen for purpose of illustration, it should be apparent that numerous modifications could be made thereto by those skilled in the art without departing from the basic concept and scope of the invention.

What is claimed is:

1. An oscillator comprising a plurality of logical circuits of a same type having a same number of input terminals connected in a ring, wherein;
    an even number of the logical circuits are connected, and
    an output node of each logical circuit is connected to an input node of each logical circuit up to the logical circuit connected to exactly the same number of input terminals worth of places ahead.

2. The oscillator as set forth in claim 1, wherein a number of the logical circuits is not a multiple of the number of the input terminals plus one and is an even multiple of a greatest common divisor of the number of input terminals plus one and the number of logical circuits.

3. The oscillator as set forth in claim 1, wherein said logical circuits comprise NAND circuits.

4. The oscillator as set forth in claim 1, wherein said logical circuits comprise NOR circuits.

5. The oscillator as set forth in claim 1, wherein a number of phases of output clocks is the same as the number of logical circuits.

* * * * *